(12) United States Patent
Lestician

(10) Patent No.: US 10,141,096 B2
(45) Date of Patent: Nov. 27, 2018

(54) ENERGY SAVING DEVICE WITH INDUCTIVE CAPACITIVE REACTOR

(71) Applicant: BASIC POWER, INC., East Stroudsburg, PA (US)

(72) Inventor: Guy J. Lestician, East Stroudsburg, PA (US)

(73) Assignee: Basic Power, Inc., East Stroudsburg, PA (US)

( * ) Notice: Subject to any disclaimer, the term of this patent is extended or adjusted under 35 U.S.C. 154(b) by 0 days.

(21) Appl. No.: 15/732,353

(22) Filed: Oct. 30, 2017

(65) Prior Publication Data
US 2018/0130598 A1    May 10, 2018

Related U.S. Application Data

(63) Continuation-in-part of application No. 13/999,481, filed on Mar. 4, 2014, now abandoned.

(51) Int. Cl.
| H01F 21/02 | (2006.01) |
| H01F 27/24 | (2006.01) |
| H01F 27/28 | (2006.01) |
| H03H 7/01 | (2006.01) |

(52) U.S. Cl.
CPC ............. *H01F 27/24* (2013.01); *H01F 27/28* (2013.01); *H01F 27/2823* (2013.01); *H03H 7/0138* (2013.01)

(58) Field of Classification Search
CPC .......... H01F 27/25; H01F 27/38; H01F 27/40; H01F 27/42; H01F 27/427; H01F 27/2823; H01F 38/18; H01F 38/30; H01F 38/26; H01F 6/006; H01F 30/10; H01F 30/12; H01F 30/16; H01F 19/04; H01F 19/08
USPC ........... 323/355–363; 336/12, 170, 171, 172, 336/173, 174, 180, 182–183, 213, 229
See application file for complete search history.

(56) References Cited

U.S. PATENT DOCUMENTS

| 4,907,246 | A | * | 3/1990 | Kleiner | G05F 3/06 323/335 |
| 5,039,920 | A | | 8/1991 | Zonis | |
| 5,287,040 | A | | 2/1994 | Lestician | |
| 5,323,090 | A | | 6/1994 | Lestician | |
| 5,612,597 | A | | 3/1997 | Wood | |
| 5,929,738 | A | * | 7/1999 | Orlando | H01F 19/04 336/12 |
| 6,037,686 | A | * | 3/2000 | Schonauer | H01F 37/00 310/68 R |
| 7,312,582 | B2 | | 12/2007 | Newman, Jr. et al. | |
| 7,952,293 | B2 | | 5/2011 | Kelly | |
| 8,441,210 | B2 | | 5/2013 | Shteynberg et al. | |

* cited by examiner

*Primary Examiner* — Nguyen Tran
(74) *Attorney, Agent, or Firm* — Rosenberg, Klein & Lee

(57) ABSTRACT

An energy saving device with at least one inductive capacitive reactor for residential use and similar low amperage uses functions as a multifaceted transformer with inductive and capacitor functionalities iteratively. It includes a stacked group of hollow centered continuous loop components sequentially arranged as follows: (i) a first ferrite toroidal component; (ii) a first separator component, being a doped separator component; (iii) a non-magnetic conductive metal toroidal component having a plurality of protrusions with notches between said protrusions; (iv) a second separator component, selected from the group consisting of doped and non-doped; (v) a second ferrite toroidal component.

20 Claims, 14 Drawing Sheets

ENERGY SAVING DEVICE WITH INDUCTIVE CAPACITIVE REACTOR

REFERENCE TO RELATED APPLICATIONS

The present application is a continuation in part of co-pending U.S. patent application Ser. No. 13/999,481, filed on Mar. 4, 2014, by the same inventor herein and having the same assignee, titled "Systems For Reducing Electrical Consumption Using Triple Core Iterative Transformers".

BACKGROUND OF INVENTION a. Field of Invention

The present invention relates to electrical power supply, and more particularly to improvements in systems for conserving electrical energy consumption in lower amperage commercial, industrial, residential, or other energy consumption settings, including "at the meter" installations, as well as at the electrically-consuming equipment installations, including permanently installed devices, such as industrial drive motors, and portable devices, such as plug-in refrigerators. Prior art systems utilize various filters, transformers and other components to raise power factor, to lower harmonics, to filter out noise and to make adjustments for and correct effects of surges and drops. The above cited co-pending patent application discloses improvements on such devices. One of the features of that co-pending application invention is the use of iterative transformers in place of prior art transformers and/or other prior art components. The present invention is now directed to energy saving devices that include an improvement over the iterative transformers of the co-pending application, and, more specifically, the present invention is directed to energy saving devices with low amperage inductive capacitive reactors that replace those iterative transformers. The present invention energy saving devices with inductive capacitive reactors are more advanced and efficient and more accurate than the above cited iterative transformers and the devices that preceded the iterative transformer energy saving devices. The present invention includes one phase, two phase and three phase capabilities that are further described below. They are not limited to but are particularly useful in buildings that conserve electrical energy consumption with control devices at or near incoming power breakers or at power inlets for energy consuming devices, equipment and appliances to increase efficiency relating to loads, distortions, spikes and/or power factors, as well as other deviant characteristics. In addition, this present invention energy saving device has inductive capacitive reactors that improve response time and result in more energy savings than the prior art electric power supply energy saving systems, including those previously developed by the present inventor. In summary, the present invention reactors and energy saving devices utilizing them improve many power quality conditions, including harmonic reduction, surge suppression, sag mitigation, swell mitigation, in-rush current limitations, phase balancing, phase synthesis and power factor correction.

b. Description of Related Art

The following patents are representative of systems and devices for conservation of electric consumption:

U.S. Pat. No. 4,163,218 relates to an electronic control system for controlling the operation of a plurality of electrical devices which are energized from AC power lines which includes a single, central unit connected to the power lines, which further includes a central transceiver means for transmitting an encoded oscillating signal of one frequency onto the power lines, a central encoding means for encoding means for encoding the oscillating signal with an encoded signal in synchronization with the frequency of the AC power for selective control of electrical devices, and a central control means connected to the encoding means for selecting the electrical device to be controlled and its desired state. The invention further includes unitary switch units respectively interconnected between power lines and each electrical device being operative for both local and centralized control of the electrical device with the local control and the centralized control placing the electrical device in respective opposite states from each other, each switch unit including a switch transceiver means for receiving the encoded oscillating signal from the power lines, a switch decoding means coupled to the switch transceiver means for detecting the encoded signal, a switch control means connected to the switch decoding means for setting the selected electrical device to the desired state, and a local control means for selectively locally operating the electrical device independently of the central unit and placing the electrical device in a state opposite from that which it was placed by the central unit.

U.S. Pat. No. 4,845,580 describes a spike elimination circuit for A.C. and D.C. power sources which comprises two gas tubes and/or two semiconductor voltage limiting devices before a Bandpass Filter. The Bandpass Filter consists of 2 capacitors to ground and inductor in series with the line. The spike eliminator can be portable, mobile, or hard wired for the protection of home controls and electronics, telecommunications, commercial and industrial controls and the computer field and others.

U.S. Pat. No. 4,870,528 describes a surge suppressor which comprises a first series circuit having a first inductance and a first alternating voltage limiter, including at least a first capacitance and a bidirectionally conductive rectifying circuit for charging the first capacitance, coupled between first and second input terminals for limiting surge currents and voltage excursions coupled to first and second load output terminals. The first alternation voltage limiter further comprises a sensing circuit for sensing at least one of the charging current supplied to the voltage developed across the first capacitance. An auxiliary energy storage circuit and a normally open switching device responsive to the sensing circuit are provided for coupling the auxiliary energy storage circuit across the first capacitance during high energy surge conditions.

U.S. Pat. No. 5,105,327 describes a power conditioner for AC power lines which has a choke and capacitor coupled in series across the power lines. The choke comprises a coil termination in a line, with the line looped back through the coil. The power lines are thereby balanced to provide greater operating efficiency. Capacitors and transient suppressors (e.g. varistors) are used for transient suppression and power factor correction.

U.S. Pat. No. 5,420,741 relates to an arrangement for obtaining flux rate information in a magnetic circuit including passive means connected across a flux rate sensor for implementing control of said flux rate. The passive means being a tuned magnetic flux rate feedback sensing and control arrangement wherein impedance is tuned and the energy loss characteristic is adjustable. The selection of inductance and capacitance values provides tuning and the selection of resistance affects the energy loss characteristics.

U.S. Pat. No. 5,432,710 is directed to an energy supply system for supplying, in system interconnection, power at a power receiving equipment from a power plant and power generated by a fuel cell to a power consuming installation, and supplying heat generated by the fuel cell to a heat consuming installation. This system includes an operation amount computing device for computing an amount of operation of the fuel cell to minimize an equation y–aXL+bXM+cXN, in response to an energy demand of the power consuming installation and heat consuming installation A control device controls the fuel cell to satisfy the amount of the operation computed. The system supplies energy in optimal conditions with respect to the cost borne by an energy consumer, consumption of primary energy and release of environmental pollutants. Energy is effectively used from the standpoint of the energy consumer and a national point of view.

U.S. Pat. No. 5,436,513 relates to an information handling system which is described as having a power supply and having a switching circuit that switches a plurality of energy sources between series and parallel couplings. Associated with the switching circuit is a voltage level detecting circuit for monitoring the voltage level of the energy sources. A processor for controlling the information handling system responds to the voltage level detecting circuit and in the event of a low voltage condition the processor activates the switching circuit to switch the energy sources and from a series to a parallel coupling. Alternatively, the processor responds to other inputs or conditions for actuating the switching circuit.

U.S. Pat. No. 5,459,459 is directed to an algorithm for implementation in a meter register and a reading device. In the one embodiment, the invention enables selecting a display table to be read from the register, updating the billing read date and time in the register, reversing the order in which load profile data is transmitted from the register to the reader, specifying the number of load profile intervals to be read from the register and specifying the number of intervals to skip when reading from the register.

U.S. Pat. No. 5,462,225 relates to an apparatus and method for controlling energy supplied to a space conditioning load and for overriding a load control operation in response to measuring certain space temperatures within a closed environment. The load control apparatus includes a control device connected to an electrical distribution network and to a space/conditioning load and a temperature sensing device connected to the control device. The control device conducts a load shedding operation to control distribution of electrical energy to the space conditioning load in response to command signals supplied by a remote command center. The temperature sensing device operates to override the load shedding operation by outputting a control overriding signal to the control device tin response to sensing certain space temperatures within the closed environment. If the temperature control device is connected to an air conditioning system the temperature sensing device causes the control device to terminate the load shedding operation prior to expiration of a selected time period in response to measuring a space temperature that exceeds a maximum space temperature limit. In contrast, if the temperature control device is connected to a forced air beating system, the temperature sensing device causes the control device to terminate the load shedding operation when a measured space temperature drops below a minimum space temperature limit the maximum space temperature limit is greater than the control temperature setpoint of a thermostat that controls the space conditioning operations, whereas the minimum space temperature limit is less than the control temperature setpoint.

U.S. Pat. No. 5,483,672 relates to a communication system, where a communication unit may conserve source energy when it is inactive in the following manner. The control channel is partitioned into a predetermined number of windows and a system window which are transmitted on the control channel in a round robin manner. When the communication unit registers with the communication system, it is assigned to a window group. The communication unit then monitors only the system window to determine whether the window group that its been assigned to is also assigned to one of the predetermined number of windows. When the window that has been assigned to the window group is being transmitted to the control channel the communication unit activates to monitor that window. Once the window is no longer being transmitted, the communication unit deactivates unit the system window is being transmitted or the window assigned to the window group is being transmitted.

U.S. Pat. No. 5,495,129 relates to an electronic device fore multiplexing several loads to the terminals of a source of alternating electrical energy. The source of alternating electrical energy is coupled by electromagnetic flux to the loads by using primary excitation windings and connects to the terminals of the source of alternating electrical energy and secondary windings respectively corresponding to the number of loads. The secondary windings are at least partially coupled to the primary winding and are each connected to the terminals of a load. The coupling is inhibited by auxiliary winding which are each totally coupled with the secondary winding. The inhibition function is controlled in order to inhibit all the magnetic couplings except for one and this particular one changes as a function of the respective loads to be coupled to the source of alternating electrical energy.

U.S. Pat. No. 5,512,831 relates to a system for testing electrochemical energy conversion and storage devices includes means for sensing the current from the storage device and varying the load across the storage device in response to the current sensed. The system is equally adaptable to batteries and fuel cells. Means is also provided to sense system. Certain parameters are then stored in digital form for archive purposes and certain other parameters are used to develop control signals in a host processor.

U.S. Pat. No. 5,517,188 is directed to a programmable identification apparatus, and associated method, includes a transceiver and a transponder. The transponder is powered by the energy of a transceiver transmit signal generated by the transceiver and includes a programmable memory element. A coded sequence which uniquely identifies the transponder is stored in the programmable memory element and, when transponder is powered, the transponder generates a transponder signal which includes the coded sequence stored in the programmable memory element, once modulated by circuitry of the transponder.

U.S. Pat. No. 5,528,123 measures the total line current in a power cord which is used to energize both a power factor corrected system and a non-power factor corrected AC loads. The power factor control loop of the power factor corrected system is then driven to correct the power factor of total line current in the power cord ideally to approach unity.

U.S. Pat. No. 5,640,314 relates to a symmetrical ac power system which provides a balanced ac output, whose maximum voltage with respect to a reference ground potential is one-half the ac output voltage, and which is derived from a single phase ac source through the use of an isolation transformer having a center-tapped secondary winding. The center tap is connected to the output power load circuit as a ground reference potential with respect to the symmetrical ac output so as to constitute the reference ground potential for the power supply and load. Since symmetrical ac power is applied to the load by the system, reactive load currents, other power artifacts, EMI and RFI emissions and other interference and noise components ordinarily resulting from the application of conventional ac power to the load are reduced or eliminated by appearing as equal inversely phased signal elements which cancel one another. In order to maximize the performance of the symmetrical power system, the isolation transformer has a bifilar-wound secondary winding.

U.S. Pat. No. 5,646,458 describes a UPS (uninterruptible power system) which includes an UPS power conditioning unit that provides conditioned AC power to a critical load. The UPS power conditioning unit includes a variable speed drive that operates in response to AC utility power or to a standby DC input by providing a motor drive signal. The UPS power conditioning unit further includes a motor-generator that operates in response to the motor drive output by providing the conditioned AC power to the critical load. In response to an outage in the utility AC power, standby DC power is provided by a standby DC power source that includes a variable speed drive and a flywheel motor-generator connected to the variable speed drive. Both the UPS power conditioning unit and the standby DC power source are initially operated in response to the utility AC power, the flywheel motor-generator storing kinetic energy in a rotating flywheel. When an outage occurs, the rotating flywheel continues to operate the flywheel motor-generator of the standby DC power source, causing the production of AC power which is rectified and provided as standby DC power to operate the variable speed drive of the UPS power conditioning unit either the utility AC power outage is over or a standby emergency generator is brought on line.

U.S. Pat. No. 5,880,677 relates to a system that monitors and controls electrical power consumption that will be retrofitted to a typical consumer electrical power arrangement (typical arrangement-electrical feed line from a provider, a meter, a circuit breaker and individual input wiring to a plurality of electrical devices, appliances and outlets). The system includes a control unit which receives information from an electromagnetic pickup device from which real time electrical consumption is determined over very short periods of time. The control unit has a main data processing and storage processor for retaining information and it may include a communication microprocessor for sending signals to corresponding modules. The electromagnetic pickup device uniquely measures the electromagnetic flux emanating at each output wire from each of the individual circuit breakers in a breaker box. The modules have filters which release electrical power to the individual electrical devices, appliances and outlets at a controlled, economic rate.

U.S. Pat. No. 5,892,667 describes a symmetrical as power system which provides a balanced ac output, whose maximum voltage with respect to a reference ground potential is one-half the ac output voltage, and which is derived form a single phase ac source through the use of an isolation transformer having a center-tapped secondary winding. The center tapped is connected to the output power load circuit as a ground reference potential with respect to the symmetrical ac output so as to constitute the reference ground potential for the power supply and load. Since symmetrical ac power is applied to the load by the system, reactive load currents, other power artifacts, EMI and RFI emissions and other interference ad noise components ordinarily resulting from the application of conventional ac power to the load are reduced or eliminated by appearing as equal inversely phased signal elements which cancel one another. In order to maximize the performance of the symmetrical power system, the isolation transformer has a bifilar-wound secondary winding.

U.S. Pat. No. 6,009,004 discloses a new single-phase passive harmonic filter for one or more nonlinear loads. The filter improves the total system performance by drastically reducing the line side current harmonics generated by non-linear loads. The filter includes two inductor portions across one of which is connected a tuning capacitor. The parallel combination of one inductor portion which the tuning capacitor forms a series tuned filter configuration while the second inductor portion is used for harmonic attenuation. A shunt capacitor is employed for shunting higher order harmonic components. A single-phase passive voltage regulator provides the needed voltage bucking to prevent over voltage at the load terminals of the filter. The filter provides an alternate path for the harmonic current generated by non-linear loads. The over voltage caused by the increased capacitive reactance is controlled by either capacitor switching or by the use of the passive voltage regulator or a combination of the two. Capacitor switching is dependent upon load conditions.

U.S. Pat. No. 6,014,017 describes a method and an apparatus for power factor correction for a non-ideal load, which is supplied for a main power supply, by a compensation device which is electrically connected in parallel with the load and has a pulse converter with at least one capacitive store. A transfer function space vector is calculated as a function of a determined mains power supply voltage space vector, a mains power supply current space vector, a compensator current space vector and of an intermediate circuit voltage which is present on the capacitive store. As a result of which the pulse converter generates a compensator voltage space vector on the main power supply side as a function of the intermediate circuit voltage. A compensator current space vector, that keeps the undesirable reactive current elements away from the mains power supply, is thus obtained via a coupling filter that is represented as a compensator inductance.

U.S. Pat. No. 6,058,035 describes a method wherein after starting the input of a switching signal to a booster circuit whose boosting rate is changeable in accordance with the duty ratio of the inputted switching signal and calculating the output power of an inventor circuit, which is connected to the subsequent stage of the booster circuit, from the output current of the inverter circuit, the target voltage after boosting by the booster circuit is obtained based on the output power. If the actual output voltage of the booster circuit is lower then the target voltage, the duty ratio of the above switching signal is increased, and if higher, the duty ratio of the above switching signal is decreased.

U.S. Pat. No. 6,384,583 B1 is a system including, in-parallel connection to an incoming power supply of a facility including a hot line and a neutral line, and at least one ground. There are components connected between the hot line and the neutral line in the order of: front metal oxide varistors; line transient voltage surge suppressor having to suppress undesired power spikes; at least one capacitor of predetermined capacitance; at least two dual chokes in the form of inductor/metal oxide varistor transformers; at least a second capacitor of its own predetermined capacitance;

metal oxide varistors having a predetermined capability. In preferred embodiments, the metal oxide varistor may be a plurality of varistors in parallel; a failure indicator circuit connected to the transient voltage surge suppressor, including at least one relay, one voltage-surge responsive switch and one indicator signaling component.

U.S. Pat. No. 6,448,747 B1 is an electricity pod controller device that includes in-parallel connection to an incoming power supply of a facility including a hot line and a neutral line, and at least one round. There are components connected between the hot line and the neutral line. At least one front metal oxide varistor line transient voltage surge suppressor has a predetermined capability to suppress undesired power spikes and at least one capacitor of predetermined capacitance are also included. At least two dual chokes in the form of inductor/metal oxide varistor transformers, a second capacitor of its own predetermined capacitance and at least one metal oxide varistor having a predetermined capability. In preferred embodiments, the metal oxide varistor may be a plurality of varistors in parallel.

U.S. Pat. No. 7,573,253 B2 to Lestician describes a system for managing electrical consumption that includes a connecting means for connection to an incoming power supply of a facility, for connection in parallel, including a hot line and a neutral line, and at least one ground. The following components are connected between the hot line and the neutral line. They are connected in the order of at least one front capacitor of predetermined capacitance, at least one front arc suppressor, at least one front metal oxide varistor line transient voltage surge suppressor having a predetermined number of joules capability to suppress undesired power spikes, at least two inductor/metal oxide varistor iterative transformers, at least a second capacitor of its own predetermined capacitance, at least one metal oxide varistor having a predetermined number of joules capability and at least two capacitors, each having its own predetermined capacitance different form one another.

Thus, while there is extensive prior art in the field, none teach the present invention herein. Notwithstanding the prior art, the present invention is neither taught nor rendered obvious thereby. Preferred are sandwiched separator components with a dielectric middle layer and conductive top and bottom coats or sheets of conductive material, such as metal or conductive graphite.

SUMMARY OF THE INVENTION

The present invention is directed to energy saving devices with an inductive capacitive reactor for residential, industrial and similar low amperage (less than 1 amp up to one hundred amps) needs that functions as a multifaceted transformer with both inductive and capacitor functionalities that operates iteratively. The present invention energy saving devices have components that include: an EMI filter; surge suppression mechanism; harmonic filters; a snubber network filter; and storage components; and include at least one low amperage inductive capacitive reactor. The at least one low amperage inductive capacitive reactor includes a stacked group of hollow centered continuous loop components sequentially arranged as follows: (i) a first ferrite toroidal component; (ii) a first separator component, being a doped separator component; (iii) a non-magnetic conductive metal toroidal component having a plurality of protrusions with notches between the protrusions; (iv) a second separator component, selected from the group consisting of doped and non-doped; (v) a second ferrite toroidal component.

In some embodiments of the present invention energy saving device with at least one inductive capacitive reactor, the doped separator contains dope selected from the group consisting of gallium nitride, gallium arsenide, boron nitride, graphite, and graphene.

In some embodiments of the present invention energy saving device with at least one inductive capacitive reactor, the ferrite toroidal component has a frequency in the range of 25 Hertz to 1 Gigahertz.

In some embodiments of the present invention residential inductive capacitive reactor, the hollow centered continuous loop components have top view footprints selected from the group consisting of circular, oval, square, rectangular, and polygonal.

In some embodiments of the present invention energy saving device with at least one inductive capacitive reactor, the separator components are dielectric film separator components. Preferred are sandwiched separator components with a dielectric middle layer and conductive top and bottom coats or sheets of conductive material, such as metal or conductive graphite.

In some embodiments of the present invention energy saving device the at least one inductive capacitive reactor has a first non-conductive end piece on top of the first ferrite toroidal component and has a second non-conductive end piece under the second ferrite toroidal component. In some of these embodiments, the at least one inductive capacitive reactor the first non-conductive end piece on top of the first ferrite toroidal component and the second non-conductive end piece under the second ferrite toroidal component are selected from the group consisting of fiberglass, fiberglass encapsulation, epoxy and epoxy encapsulation.

In some embodiments of the present invention energy saving device, it further includes a multiphase arrangement of more than one such inductive capacitive reactor connected directly or indirectly to one another selected from the group consisting of two the inductive capacitive reactors for a two phase combination, and three inductive capacitive reactors for a three phase combination.

In some more specific embodiments of the present invention energy saving device wherein the at least one inductive capacitive reactor functions as a multifaceted transformer along with both inductive and capacitor functionalities and that operates iteratively, the energy saving device includes: a.) connecting means for connection to an incoming power supply of a facility, for connection in parallel, including a hot line and a neutral line, and at least one ground, and having the following components connected between the hot line and the neutral line, in the following order; b.) at least one front capacitor of predetermined capacitance, with a resistor; c.) at least two front arc suppressors; d.) at least one front metal oxide varistor line transient voltage surge suppressor having a predetermined number of joules capability to suppress undesired power spikes; e.) at least one inductive capacitive reactor; f.) at least a second capacitor of its own predetermined capacitance; g.) at least one metal oxide varistor having a predetermined number of joules capability; h.) at least two capacitors, each with a resistor, each of the at least two capacitors, each having its own predetermined capacitance different from one another; wherein the at least one inductive capacitive reactor includes a stacked group of hollow centered continuous loop components sequentially arranged as follows: (i) a first ferrite toroidal component; (ii) a first separator component, being a doped separator component; (iii) a non-magnetic conductive metal toroidal component having a plurality of protrusions with notches between the protrusions; (iv) a second separator component, selected from the group consisting of doped and non-doped; (v) a second ferrite toroidal component; (vi) a first incoming wire being wrapped around a portion of the first ferrite toroidal component, being a hot wire; (vii.) a second incoming wire being wrapped around a portion of first ferrite toroidal component, being a ground wire; (viii.) a third incoming wire being wrapped around a portion of the second ferrite toroidal component, being a hot wire; (ix.) a fourth incoming wire being wrapped around a portion of the second ferrite toroidal component, being a ground wire. In some of these embodiments of the present invention energy saving device, the doped separator of the at least one inductive capacitive reactor contains dope selected from the group consisting of gallium nitride, gallium arsenide, boron nitride, graphite, and graphene. In some of these embodiments of the present invention, the ferrite toroidal component of the at least one inductive capacitive reactor has a frequency in the range of 25 Hertz to 1 Gigahertz. In some of these embodiments of the present invention, the separator components of the inductive capacitive reactor are dielectric film separator components. In some of these embodiments of the present invention energy saving device, the at least one inductive capacitive reactor has a first non-conductive end piece on top of the first ferrite toroidal component and has a second non-conductive end piece under the second ferrite toroidal component. The first non-conductive end piece on top of the first ferrite toroidal component and the second non-conductive end piece under the second ferrite toroidal component are preferably selected from the group consisting of fiberglass, fiberglass encapsulation, epoxy and epoxy encapsulation. In some embodiments of the present invention energy saving device, the device further includes a multiphase arrangement of more than one such inductive capacitive reactor connected directly or indirectly to one another selected from the group consisting of two the inductive capacitive reactors for a two phase combination, and three inductive capacitive reactors for a three phase combination.

In some embodiments of the present invention energy saving device and system, the at least one inductive capacitive reactor has windings as follows: the first incoming wire being wrapped around a first portion of the first ferrite toroidal component, being a hot wire, and the second incoming wire being wrapped around a second, different portion of first ferrite toroidal component, being a ground wire, and further wherein a section of the first incoming wire passes at right angles under the second incoming wire, and wherein a section of the second incoming wire passes at right angles under the first incoming wire; and, the third incoming wire being wrapped around a first portion of the second ferrite toroidal component, being a hot wire, and the fourth incoming wire being wrapped around a second, different portion of the second ferrite toroidal component, being a ground wire, and further wherein a section of the third incoming wire passes at right angles under the fourth incoming wire, and wherein a section of the fourth incoming wire passes at right angles under the third incoming wire. In some of these embodiments of the present invention energy saving device, the at least a second capacitor is a plurality of capacitors having different capacitances. In some of these embodiments of the present energy saving device, the device further includes the following component: at least one resistor having a predetermined resistance.

In some embodiments of the present invention energy saving device, the components are arranged for operating as a single phase device. In some other embodiments of the present invention energy saving device the components are duplicated to create two connected sets thereof and are arranged for operation as a two phase device. In yet some other embodiments of the present invention energy saving device, the components are triplicated therein to form three connected sets thereof and are arranged as a three phase device, and further wherein each set of the triplicated component's at least two capacitors is at least three capacitors, each having its own predetermined capacitance different from one another.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The present invention will be more fully understood when the present specification is taken in conjunction with the appended drawings, wherein.

INCORPORATION BY REFERENCE

Figure 1:
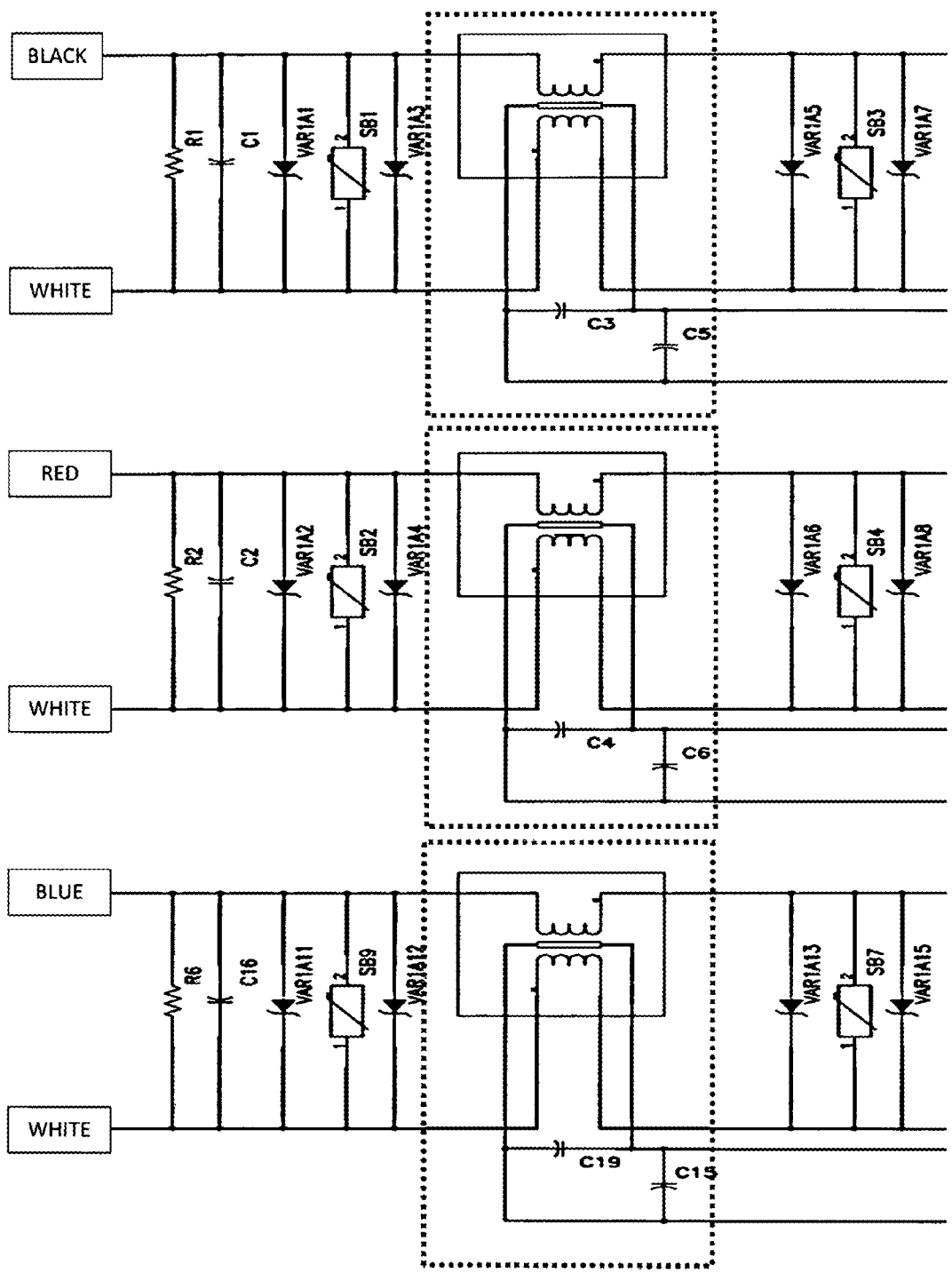
FIG. 1 illustrates a schematic diagram of a present invention energy saving device for reducing electrical consumption utilizing at least one inductive capacitive reactor in accordance with an embodiment of the present invention, for a three phase power unit.
Figure 1:
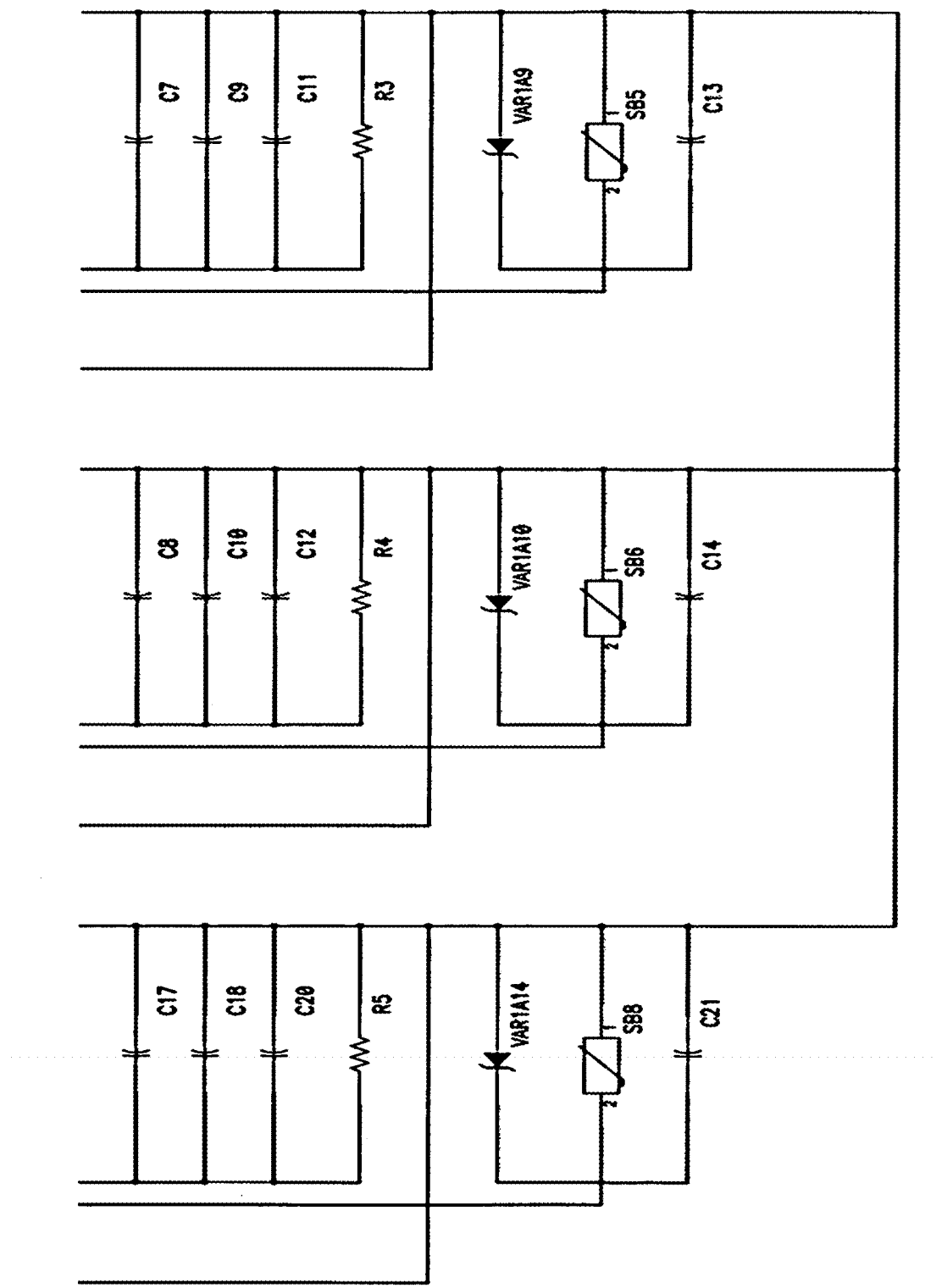

Co-pending continuation in part U.S. patent application Ser. No. 13/999,481, filed on Mar. 4, 2014, by the same inventor herein and having the same assignee, titled "Systems For Reducing Electrical Consumption Using Triple Core Iterative Transformers" is hereby incorporated by reference in its entirety, including all specification, claims and drawings.

DETAILED DESCRIPTION OF THE INVENTION

The present invention is directed to a new generation of energy saving devices using one or more new generation iterative transformers that are inductive capacitive reactors. The parent co-pending application incorporated herein by reference describes novel advanced iterative transformers. The present invention inductive capacitive reactors replace those iterative transformers and also operate iteratively, but are faster and more efficient that those iterative transformers and in many applications will be more accurate, sometimes by an order of magnitude. The present invention energy saving device with inductive capacitive reactors are utilized in many forms of energy saving devices, such as described in the co-pending parent application incorporated herein by reference, as well as modifications of other prior art energy saver devices, filters and systems. Thus, these present invention energy saving devices with inductive capacitive reactors have uses in fixed wiring, such as residential, commercial and industrial settings, typically installed at the incoming line breaker boxes, but also at substations and specific units, such as wired motor driven devices—printing presses, manufacturing lines, chemical lines, plastic product production lines, lighting systems and specific components thereof, as well as in "portable" electric devices that are plugged in, such as domestic and commercial washers and dryers, refrigeration and air conditioning units, etc.

In one preferred embodiment, the present invention energy saving device with at least one inductive capacitive reactor is used in a system that is in line with AC Incoming Voltage to an electrical load site, such as an industrial, commercial, educational or recreational facility. A typical electrical supply arrangement includes an electrical feed line from the service provider connected to all of the electrical devices in a particular location, as in the case of circuit breakers for the main source or for fuel cells or generators for large motors. In another preferred embodiment, the present invention devices with at least inductive capacitive reactor(s) are used in lower amperage energy saving devices for typically light retail (small stores) and residential environments, typically also in line with incoming AC voltage to the electrical load site. As mentioned, these devices with the present invention inductive capacitive reactors may also be installed at specific electric consuming equipment, devices and systems, and may also be installed into moveable plug-in devices and other portable devices, such as power equipment and portable and fixed power generators.

Thus, in some implementations, these inductive capacitive reactor-containing energy saving systems may be attached at the main source for such things as large motors and motor driven systems. In this manner, they reduce the harmonics in a building; lowering the total harmonic distortion (ThD) to a very low value and adjusting any low Power Factor so as to be adjusted to 0.95 or greater. A Transient Voltage Surge Suppressor (TVSS) may also be included with a feature to reduce the spikes that can be portable, mobile, or hard wired, for the protection of the location.

In conjunction with the foregoing, the present invention inductive capacitive reactors can reduce the demand for power by controlling the noise factor and regulating electrical surges and sags in a building, thereby lowering the energy consumption. These systems incorporating the present invention inductive capacitive reactors also has the ability to work with large generators and with fuel cell systems for preventing a loss of voltage and current in a given situation and maintaining power requirements needed for short periods of time. In the generator, the system not only reduces kilowatt usage being drawn but also reduces its need for fuel consumption. In the fuel cell, the system is able to suppress the surge/sag, which results in more efficiency for the fuel cell to produce more energy.

In one implementation, a parallel AC power system helps provide a balanced AC load to the potential electrical feed to the building or power supplied by the utility company by means of an electrical enclosure with its electrical parts. It is installed parallel to the main load and/or to the motors drawing the most power. It acts as a voltage and current absorber and corrects a poor power factor. It also improves the THD (Total Harmonic Distortion).

When this present invention inductive capacitive reactor in an energy saving system is connected in parallel to the source, it decreases the phase angle of current and voltage. If voltage or current are out of phase it adjusts to proper phase. This system reduces power consumption and responds to the load by means of its current draw and adjusts to the demand by lowering its storage mechanisms. It adjusts the voltage to its current demands by giving the device a supply of voltage, which results in lower demand on usage of its power consumption.

Principles of the present application are also particularly applicable to industrial settings with high current demands (e.g., with loads drawing up to 5,000 Amps). It should be recognized, however, that principles of the present invention are applicable to other electrical load settings, from the largest industrial and commercial applications to small residential and ancillary building electrifications.

FIG. 1 is a schematic diagram illustrating an electrical power conditioning system in accordance with an embodiment of the present invention. The schematic diagram of FIG. 1 is a three phase arrangement, although it should be recognized that the principles embodied in the arrangement illustrated in FIG. 1 are applicable to a single phase arrangement, a two phase arrangement, etc. In FIG. 1, the "White" line is a neutral line, and the "Red," "Blue," "Black" and "Green" are so-called "hot lines" or "hot legs." Although FIG. 1 includes specific values for circuit elements illustrated therein, in should be realized that these are exemplary values and that these values may vary depending on the particular electrical power distribution environment.

Generally, the arrangement of FIG. 1 employs a generating means connected in a paralleling noise reduction unit to the incoming power source from Red, Blue and Black lines. The White lines are preferably connected to the Green lines for beneficial grounding that enhances the functioning of the present invention devices and systems.

Capacitors C1, C2, C3, C12, C13, C14 (which are a dry film type according to one preferred present invention embodiment implementation) are connected in parallel to the front end of the unit. This helps in the reduction of the lower harmonic noise on the fundamental frequency (e.g., 30 Hz to 400 Hz) input lines. This type of arcing band pass filter, (filter capacitors) is intolerant of reverse current and heat. Run type capacitor working voltage [WV] ratings should be treated with respect. The WV rating is virtually the maximum voltage rating. Despite their more delicate nature, these filter capacitors offer substantial advantages over electrolytic filter capacitors. The main advantages are more joules of energy storage per capacitor, reduced weight and reduced volume. This combination with the dry caps is called an "Arcing Setup" in a circuit with the installed MOVs. When the capacitors are operated in series, they should share the voltage equally. In order to do this, a voltage equalizer resistor is connected across each capacitor. The equalizer resistor comes with the caps on them or in them. In FIG. 1, capacitors C6, C7, C8, C12, C13 and C14 (which are oil type capacitors for high current use according to an embodiment of the present invention) function to remove the lower fundamental frequencies of the harmonic bands with a filter for high frequency spikes, sparking and transients with a snubber network, SB1, CSB2 and SB3 (which are Quencharc type according to an embodiment of the present invention), in the circuit helping to reduce noise created by motors running on that panel box.

Capacitors C5, C6, C7, C8 (which are oil type capacitors for high current applications according to an embodiment of the present invention) are connected in series to allow for more current to pass; in addition the needed values will be half the capacitance but will allow for more current to pass through them and prevent damage to the capacitors in this manner from the harmonic noise still passing through them. The MOVs (metal oxide varistors) VAR1, VAR2, VAR3, VAR4, VAR5, VAR6 are for the transients spikes from the input line and also reduce the transponder non-fundamental frequencies for the AC line suppression for creating a very clean EMI/RFI reduction from the power lines.

Arranging three component present invention Inductive Capacitive Reactors LA1, LA2, LA3 in series on the Hot legs (Red, Blue, Black and Green) creates a low pass filter or other non-fundamental frequency currents flowing to the load but opposite in phase; filter for as setting up a current load to the source for balancing of the phases being applied to reactor capacitors C9, C10, C11 (which are oil type capacitors according to an embodiment of the present invention). This large LC type network creates a network where the current being drawn by the incoming load reacts with the power factor; this will create an imbalance load in the case of offset lagging current and creating a current generating means in which the excess power is then converted to power from the fundamental frequency then supplied back to the AC power source, which may include a generator or fuel cell.

With MOVs VAR7, VAR8, VAR9, VAR10, VAR11, VAR12 across the leading current, the MOV's now can reduce the major part of the voltage transients whereas the current now will be reduced at the source. Capacitors C15, C16, C17 (which are oil type capacitors for high current according to an embodiment of the present invention) are provided in the circuit for added protection of the stray harmonics that could damage the upcoming capacitance stage, whereas this will keep the capacitors from having more current through them to prevent an unwanted catastrophic failure. The output stage with one or more capacitors is acting as a Voltage/Current storage device; wired as a "Y" or delta configuration sets up a Kvar injection to the incoming source for proper balancing of all voltage and current fields across the current power source. The resistors R4, R5, R6 in conjunction with a lamp, displays an indication for that phase which is active.

Paralleling up to 12 of these device stages together across the 3 phases and injection of 1000 to 50000 Kvar's to the power source with great response with less noise created by the motors, resistive loads and the inductive loads; this nonlinear loading represented by non-fundamental frequency load currents in the source; the demand with harmonics on a given location creating a larger bill to the customer and not really using that demand. This will bring the demand down on a building with the reduction of harmonics, thereby stabilizing the building with cleaner AC power in the building.

The first stage of the system illustrated in FIG. 1 functions as an EMI/TVSS section for all suppressors needed for incoming voltage spikes. This band pass filter reacts to the line load by injection of Kvar's to the source. The second stage of the system illustrated in FIG. 1 acts as a variable inductive filter to handle the THD and the power factor of the line loads. The last stage of the system illustrated in FIG. 1 creates storage capacity to keep the unit under load with a voltage/current reserve for unexpected surges and sags.

Significantly, this system lowers the harmonics being produced by the motor (in the case in which the load is a motor), thereby greatly reducing the current being consumed. As an additional benefit, this keeps the motor running cooler, hence reducing the wear and tear on the motor. Furthermore, there is achieved a reduction of energy being used by means of Kw (kilowatt hours) through lowering the demand from its source. Energy savings will occur with all of these key features working together; the result being a significant (e.g., 10 to 30%) reduction of energy used by the consumer and less maintenance on motors with a cleaner energy going back to the utility company supplying the power.

Three Component Inductive Capacitive Reactor Design

According to an embodiment of the present invention, three component inductive capacitive reactors LA1, LA2, and LA3 are configured using a component, coil and winding arrangement as described herein in subsequent Figures below. Generally, a coil design according to this embodiment of the present invention employs a generating means of detecting the current in the paralleling noise reduction unit to the incoming power source. The winding wire being used may preferably be a "THWN" gas and oil type wire.

The direction of the wire from the white (Neutral) is wound in a proper manner for the magnet flux fields and have this conformingly to the windings. The Hot legs using a color such as (Black, Red, Blue) also follow this winding pattern for proper operation. This has the most effect on the loads being applied to for the direction of the currents being picked up from the source. The reaction of the white (Neutral) plays a role in where this reduces the amount of frequencies where as it puts the phasing at 180 degrees out of phase to the incoming hot leg. The means of winding the hot also places a 90 degree phase from the white, and thus counteracts the flow of current and the harmonic frequencies out of phase to the coil reactor in the circuit. This sets up the current sensing device for the voltage and the current sensing whereas it removes the fundamental frequency component acting in a manner as a notch filter device to the applied circuit; its power efficiently flows in either direction between its output storage capacitors in the circuit. Like a notch filter, this removes the fundamental frequencies and controls the current source by injecting a current back into the AC power line from the storage capacitors connected in a manner like a "Y" or Delta stage in the unit. Thus, the present invention inductive capacitive reactor provides a means of controlling the harmonics in a given power source for saving energy and the reducing harmonics (harmonics would otherwise be significantly detrimental to the life of the capacitors in a circuit). This also can be used as a current detection method in which it can replace a "CT" clamp used to detect the current in a given circuit without clamping it to the incoming line.

Figure 2:
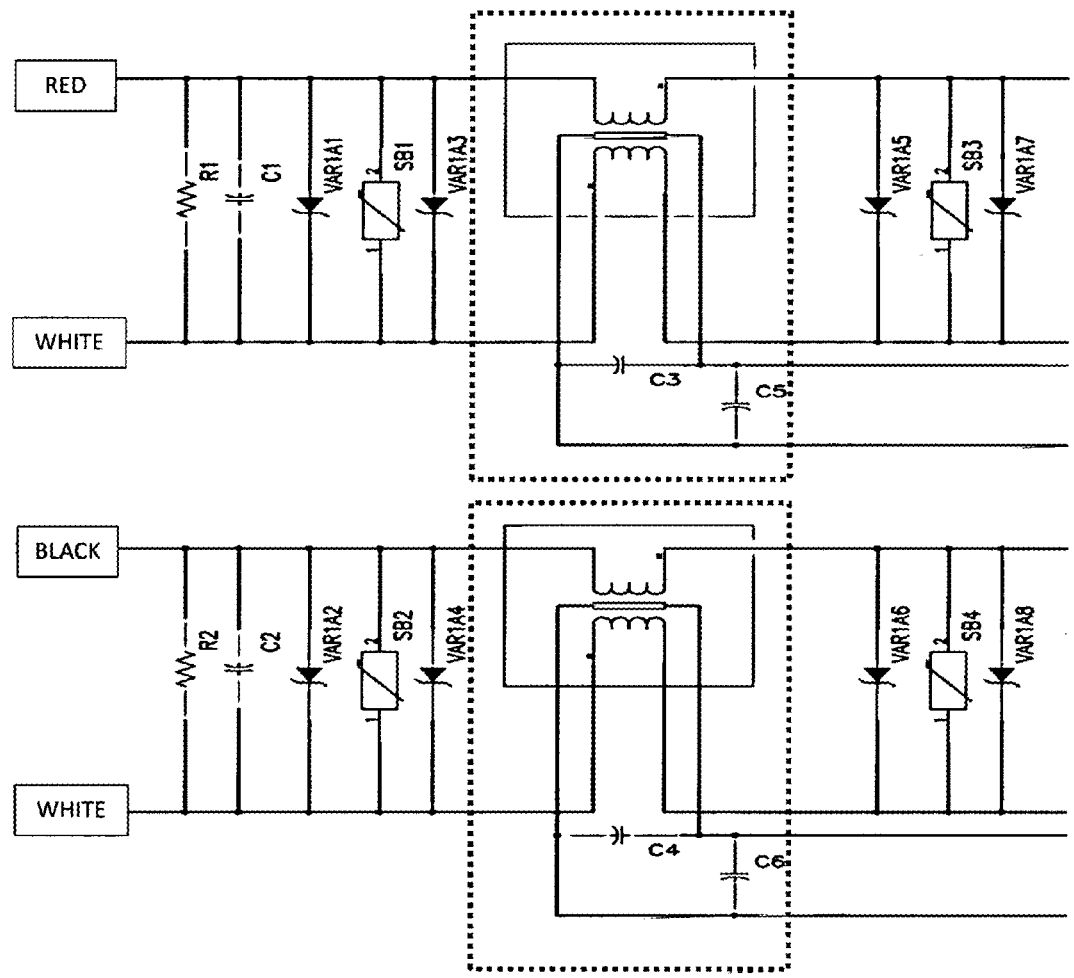
FIG. 2 illustrates a schematic diagram of a present invention energy saving device for reducing electrical consumption utilizing at least one inductive capacitive reactor in accordance with an embodiment of the present invention, for a two phase power unit.
Figure 2:
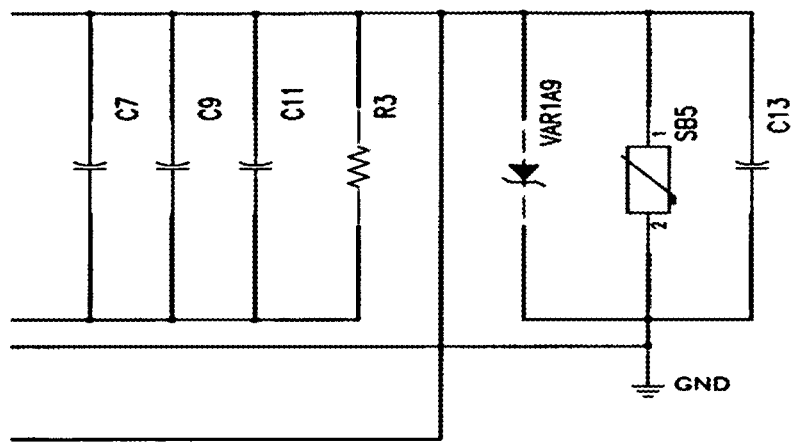
Figure 2:
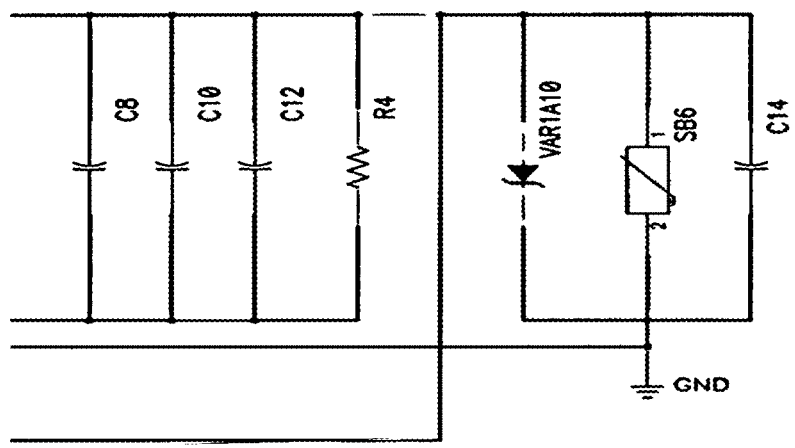

FIG. 2 shows a preferred present invention System for reducing electrical consumption utilizing inductive capacitive reactors, for a two phase unit. Thus, ⅔ of the components and arrangements are identical to the arrangements and values set forth in the top ⅔ of FIG. 1 described above. All of the components and related values shown in FIG. 1 that pertain to the FIG. 2 components are identical and need not be repeated.

Figure 3:
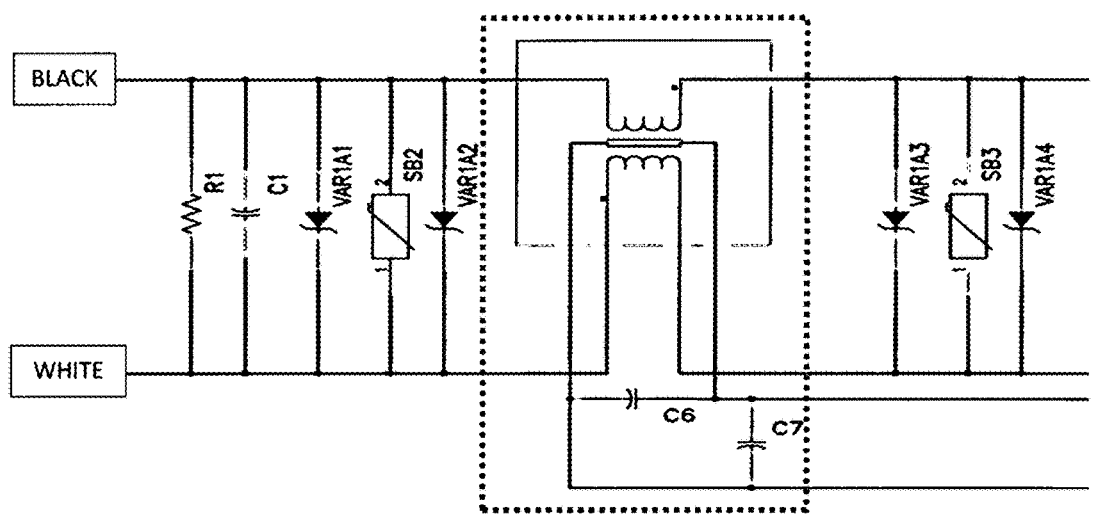
FIG. 3 illustrates a schematic diagram of a present invention energy saving device for reducing electrical consumption utilizing at least one inductive capacitive reactor in accordance with an embodiment of the present invention, for a one phase power unit.
Figure 3:
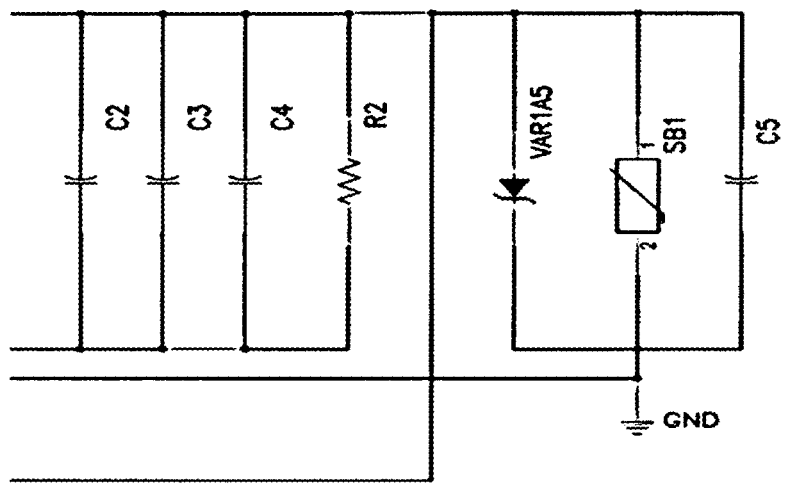

FIG. 3 shows a preferred present invention System for reducing electrical consumption utilizing triple core iterative transformers, for a one phase unit. Thus, ⅓ of the components and arrangements are identical to the arrangements and values set forth in the top ⅓ of Figure one described above. All of the components and related values shown in FIG. 1 that pertain to the FIG. 2 components are identical and need not be repeated.

Figure 4:
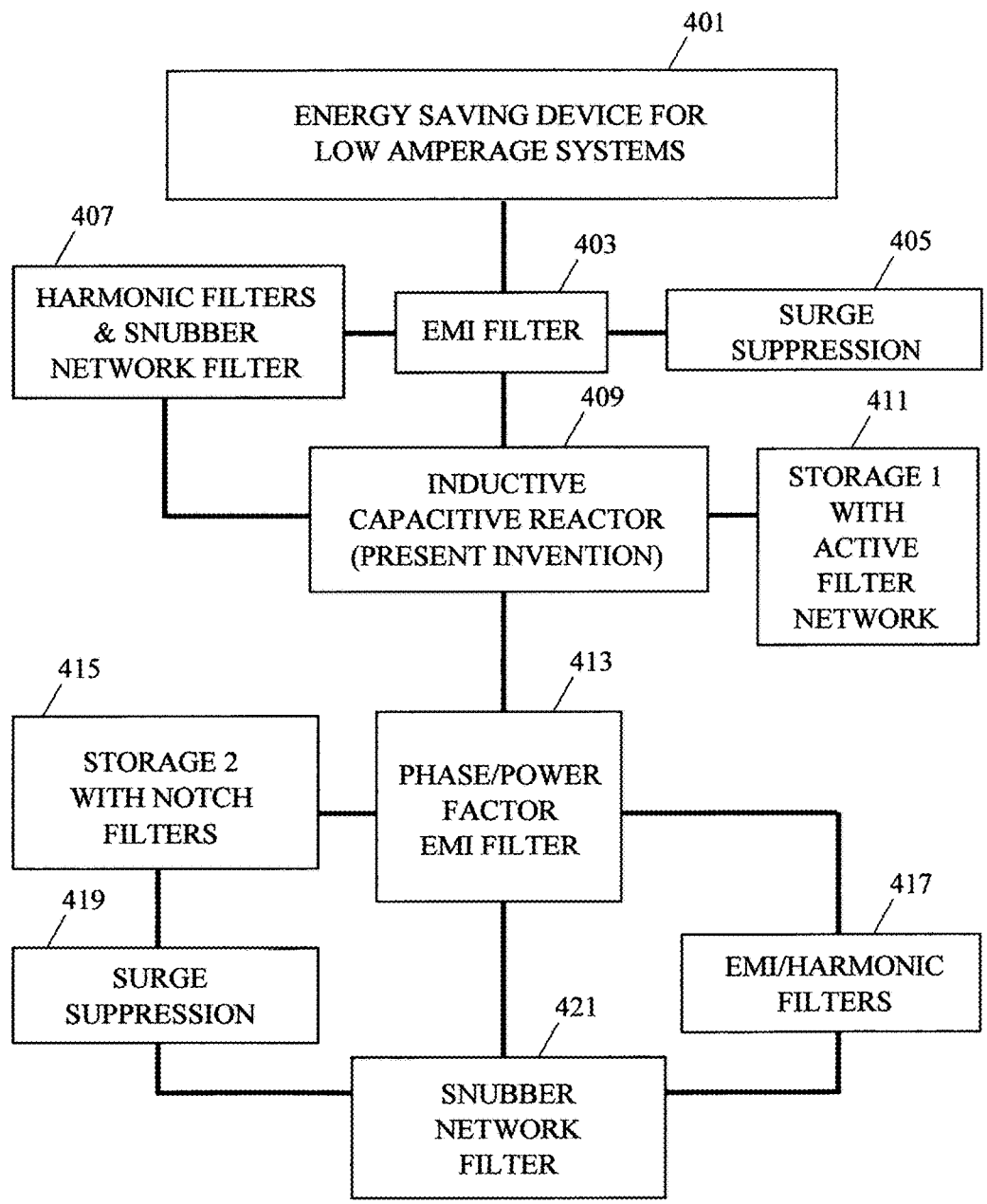
FIG. 4 shows a schematic diagram illustrating features of some present invention energy saving devices for low amperage usage with at least one inductive capacitive reactor for reducing electrical consumption.

FIG. 4 shows a schematic diagram that illustrates the preferred embodiments of the present invention energy saving devices with at least one inductive capacitive reactor in showing essential electronic features. Some of these features are known in the prior art and/or are disclosed in co-pending U.S. patent application Ser. No. 13/999,481 incorporated herein by reference above. The AC power comes into a facility with a main breaker box or through fixed (hard) wiring of an electric-consuming item of equipment or appliance, or through the connected plug of a portable appliance or equipment, and is then fed through an appropriate Energy Management System, block 401, for reducing electrical consumption. By "appropriate" is meant the correct size and model for a one phase, two phase, or three phase service. Thus, as, the system shown in block 401 may be a three phase, two phase or a one phase configuration. In other words, the present invention system of block 401 may be any of the configurations described or known such as those shown in FIGS. 1, 2, and 3 of co-pending U.S. patent application Ser. No. 13/999,481 as well as similarly functional variations and equivalents thereof, except that the iterative transformer(s) contained in those Figures are now replaced by the present invention inductive capacitive reactor(s). FIG. 4 illustrates, with boxes and connecting lines, the various electronic functions and relationships that may be deployed with the present invention inductive capacitive reactors described above and below. They include harmonic filter 403, with surge suppression 405, and harmonic filters and snubber network filter 407, interacting with inductive/transformer 409 with first power storage 411. Power factor correction, i.e., phase/power factor 413 includes an EMI filter and is connected to second power storage 415 with notch filters. Surge suppression 419, EMI/harmonic filters 417 and snubber network filter 421 are interconnected with the phase/power factor 413 and each other, as shown.

Electrical loads, such as non-linear loads, including DC motors, create harmonic distortions, electrical spikes, and poor power factor, which have negative impact on efficiency and the condition of the load itself (e.g., overheating and reduced motor life). Other internal and external physical conditions also contribute to these and other deviant (inefficient) characteristics that adversely affect electrical consumption. Thus, the present invention is an energy saving device with inductive capacitive reactor for reducing electrical consumption that includes one or more devices that recognize electromagnetic interference with means to suppress line transient voltage surges, means to regulate harmonics distortion, means to enhance power factor correction and means to maintain phase regulation by maintaining phase relationship between voltage and current at times of increased power demands, using newly discovered arrangements of components to achieve these results.

Figure 5:
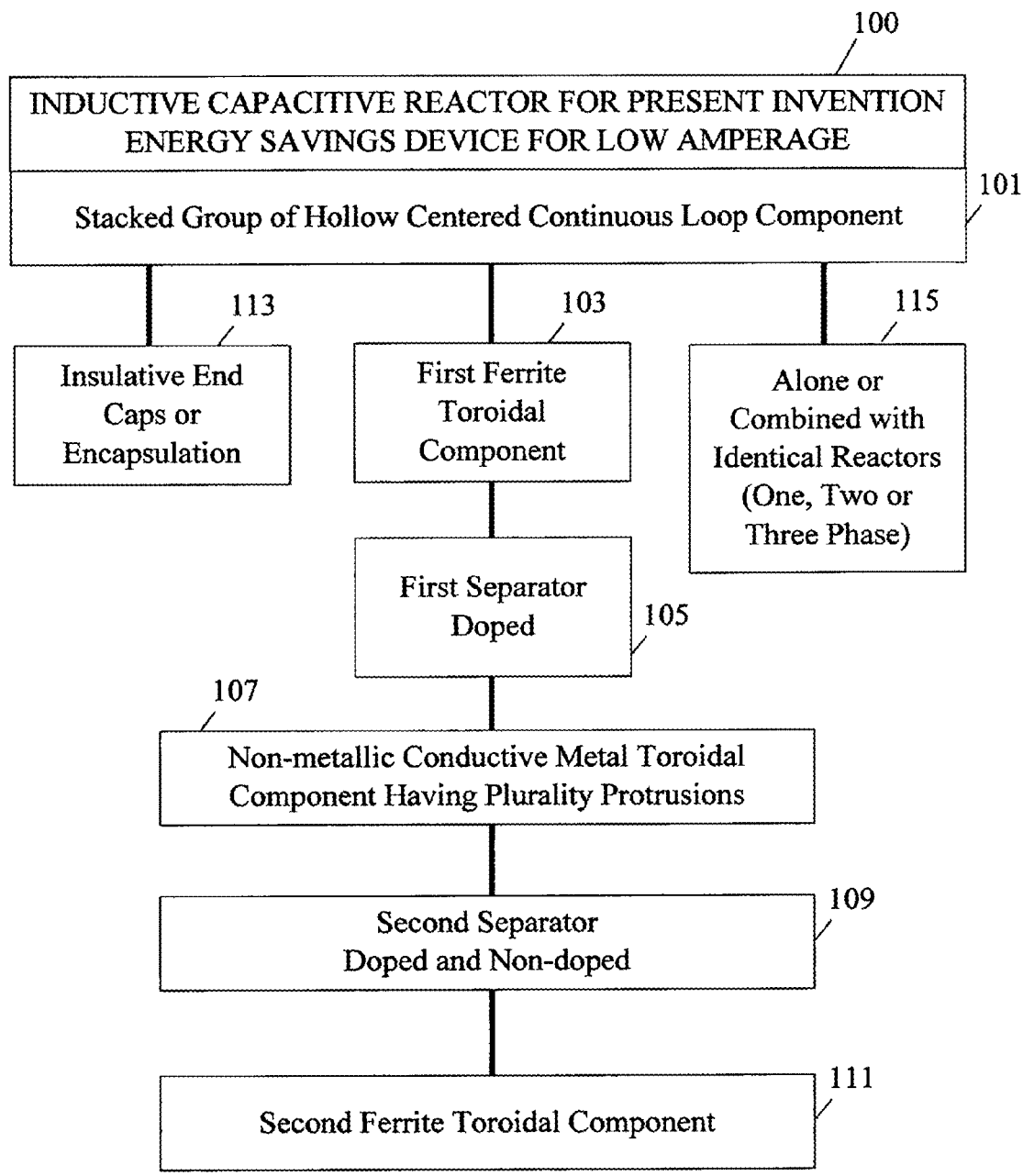
FIG. 5 illustrates a block diagram of low amperage present invention device inductive capacitive reactors, typical for residential and other low amperage uses.

FIG. 5 illustrates a block diagram of a low amperage present invention inductive capacitive reactor 100, typical for residential and other low amperage uses. This present invention inductive capacitive reactor 100 for residential and similar amperage needs that functions as a multifaceted transformer with both inductive and capacitor functionalities that operates iteratively, includes a stacked group of hollow centered continuous loop components sequentially arranged 101, as follows: a first ferrite toroidal component 103; a first separator 105, being a doped separator; a non-magnetic conductive metal toroidal component 107 having a plurality of protrusions with notches between the protrusions; a second separator 109, selected from the group consisting of doped and non-doped; a second ferrite toroidal component 111.

When the separators are doped, they may be doped with any workable doping agent and these are well known in the circuit board doping industry. In preferred embodiments, the dope is selected from the group consisting of gallium nitride, gallium arsenide, boron nitride, boron arsenide, graphite and graphene, as well as combinations thereof. In some embodiments, the separator components are dielectric film separator components. Separators may be thin plastic film, paper, paper/film composite, wax paper, or other known insulative and dielectric separators. In some cases, coatings of transformer varnish may be used. Many of the transformer varnishes are polyester resin-based. These treatments and the addition of doping agents may be achieved by vapor deposition, spray, coating, dipping, film application (heat weld, glue, etc.). The dope may be applied directly or in solution.

In some cases, graphene may be applied to the separators or the aluminum or other metal toroids. Graphene is a "miracle" coating known as a nano coating, sometimes only one or two or three atoms of carbon thick. It is commercially available, but rare and expensive. As recently described by the United States Department of Energy (Aug. 30, 2017, USDOE News Release) titled "Controlling Traffic On the Electron Highway: Researching Graphene", graphene creates a very powerful magnetic field that accelerates the movement of electrons. Thus, in the context of the present invention, the flow of electrons may be more rapid with graphene, speeding up the corrective effects of the present invention inductive capacitive reactor by rearranging the flow faster to reduce harmonics and other deficiencies and irregularities.

The ferrite toroidal components 103 and 111 of FIG. 5 may have a frequency in the range of 25 Hertz to 1 Gigahertz.

Referring again to FIG. 5, insulative end caps or encapsulation 113 may be used to isolate and protect the present invention reactor from external physical and electrical interference. This is done after windings, such as those described herein elsewhere and in the parent application incorporated herein by reference. In some preferred embodiments, the windings are or include a plurality of windings wrapped around the stacked group of hollow centered continuous loop components so as to pass through the hollow center thereof, the windings including at least one hot wire and at least one ground wire. The encapsulation may be accomplished with epoxy resin dipping or coating, or with fiberglass coatings or other known encapsulation coatings and seals. One technique involves assembling the present invention reactors in metal or other "boxes" with the other components of an energy management system (energy saving device) and pouring epoxy into the box to simultaneously encapsulate the entire contents. Alternatively, a present invention inductive capacitive reactor 100 may have a first non-conductive end piece on top of its first ferrite toroidal component and a second non-conductive end piece under its second ferrite toroidal component. This stacked pack can then be placed an insulated protective container. In any of these techniques, of course, connective wiring from windings needs to be exposed after encapsulation for connection to other energy management system components.

The first and second toroidal components 103 and all made of the same metal or different metals and are typically commercially available ferrite torroids.

Continuing on FIG. 5, the described reactor 100 may be used alone or in combination with the same or equivalents reactors. Alone or combined reactors 115: the reactor alone will be for a single phase use, with one other twin reactor, will be for a two phase use, and with two additional reactors (totaling three) will be for a three phase use. Thus, the inductive capacitive reactor 100 of FIG. 5, offers a multiphase arrangement of more than one such inductive capacitive reactor 100 connected directly or indirectly to one another selected from the group consisting of two said inductive capacitive reactors for a two phase combination, and three inductive capacitive reactors for a three phase combination.

Figure 6:
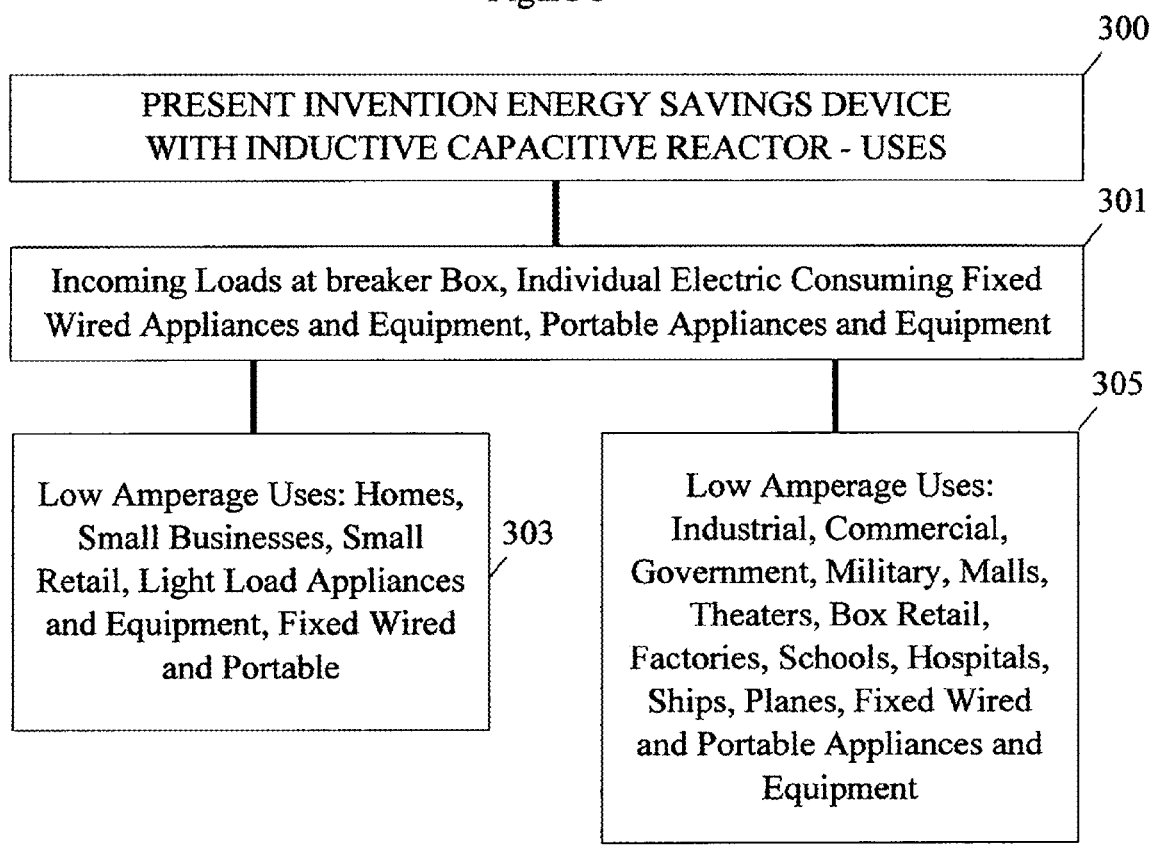
FIG. 6 illustrates a block diagram of low amperage present invention device with inductive capacitive reactors, showing some typical uses for residential and other low amperage uses.

FIG. 6 illustrates a block diagram of low amperage present invention device with inductive capacitive reactors, showing some typical uses for residential and other low amperage uses 300. These reactors (with their energy saving device components) may be used on incoming building or facility loads, individual electric-consuming devices, appliances, equipment, etc, both portable and fixed wired 301. Some examples of common low amperage uses 303 and of other low amperage uses 305 are listed, respectively.

Figure 7A:
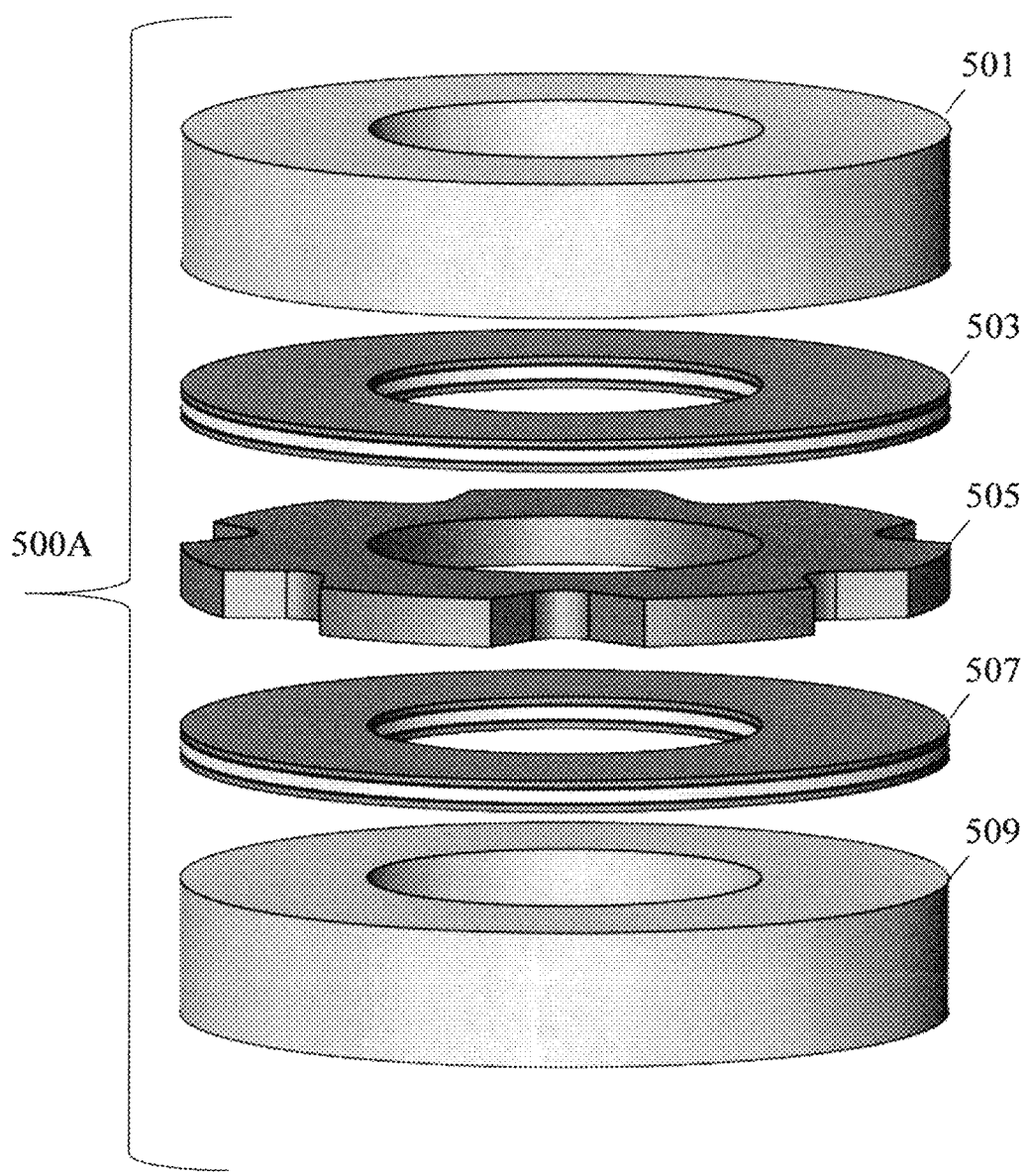
FIG. 7A shows a front oblique blown apart view of one embodiment of the present invention inductive capacitive reactor that is used for lower amperage installations, such as in the range of less than 1 amp, but certainly 1 amp, up to one hundred amps.

FIG. 7A shows a front oblique blown apart view of one embodiment of the present invention inductive capacitive reactor that is used for lower amperage installations, such as in the range of 25 amps, up to hundreds of amps. This present invention inductive capacitive reactor 500A for residential and similar amperage needs functions as a multifaceted transformer with both inductive and capacitor functionalities that operates iteratively. As can be seen, reactor 500A includes a stacked group of hollow centered continuous loop components sequentially arranged as follows: a first ferrite toroidal component 501; a first doped separator 503; a non-magnetic conductive metal toroidal component 505 having a plurality of protrusions with evenly spaced notches between said protrusions; a second separator 507, that may be doped or not doped; and a second ferrite toroidal component 509. The separators 503 and 507 are shown here as three layered separators. There is a central film or sheet, such as paper or plastic, along with top and bottom coatings or films that may be the same or different. These could be wax coatings or deposited layers of carriers, varnish, etc. with or without doping agents.

Figure 7B:
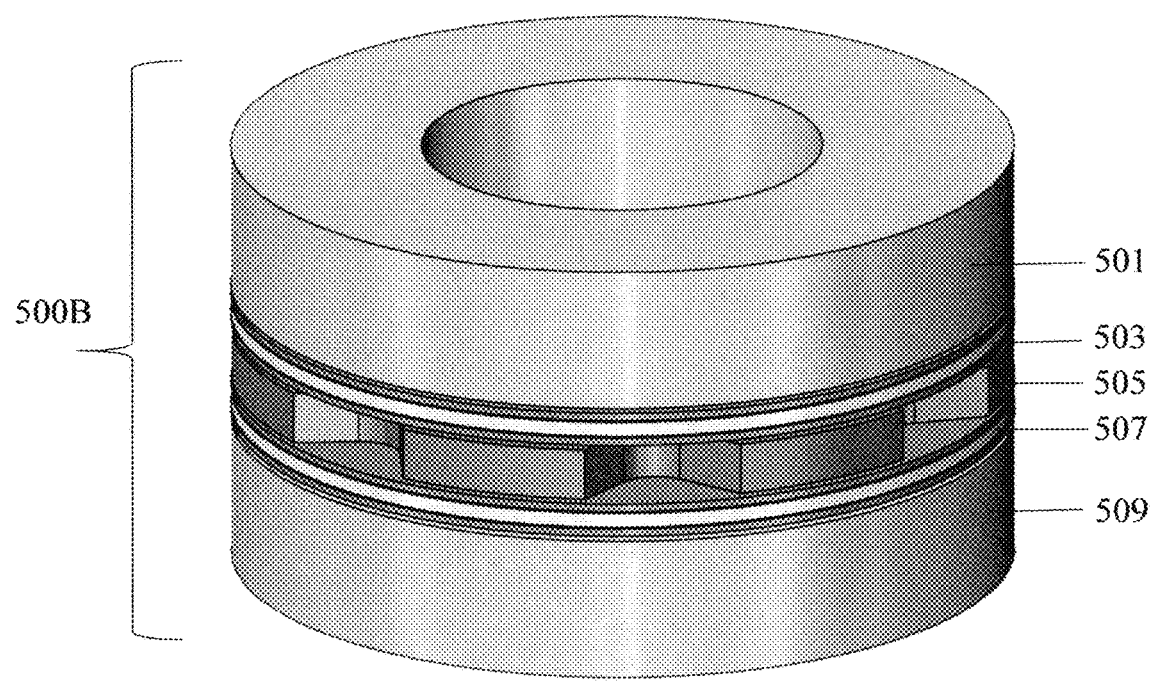
FIG. 7B shows a front oblique view of the embodiment of the present invention inductive capacitive reactor that is used for lower amperage installations and is shown in FIG. 7B, but here it is assembled (stacked)

FIG. 7B shows a front oblique view of the present invention inductive capacitive reactor 500A that is shown in FIG. 7A, but in its assembled form and thus now designated as reactor 500B. Identical parts are identically numbered as to FIGS. 7 and 6.

Figure 8:
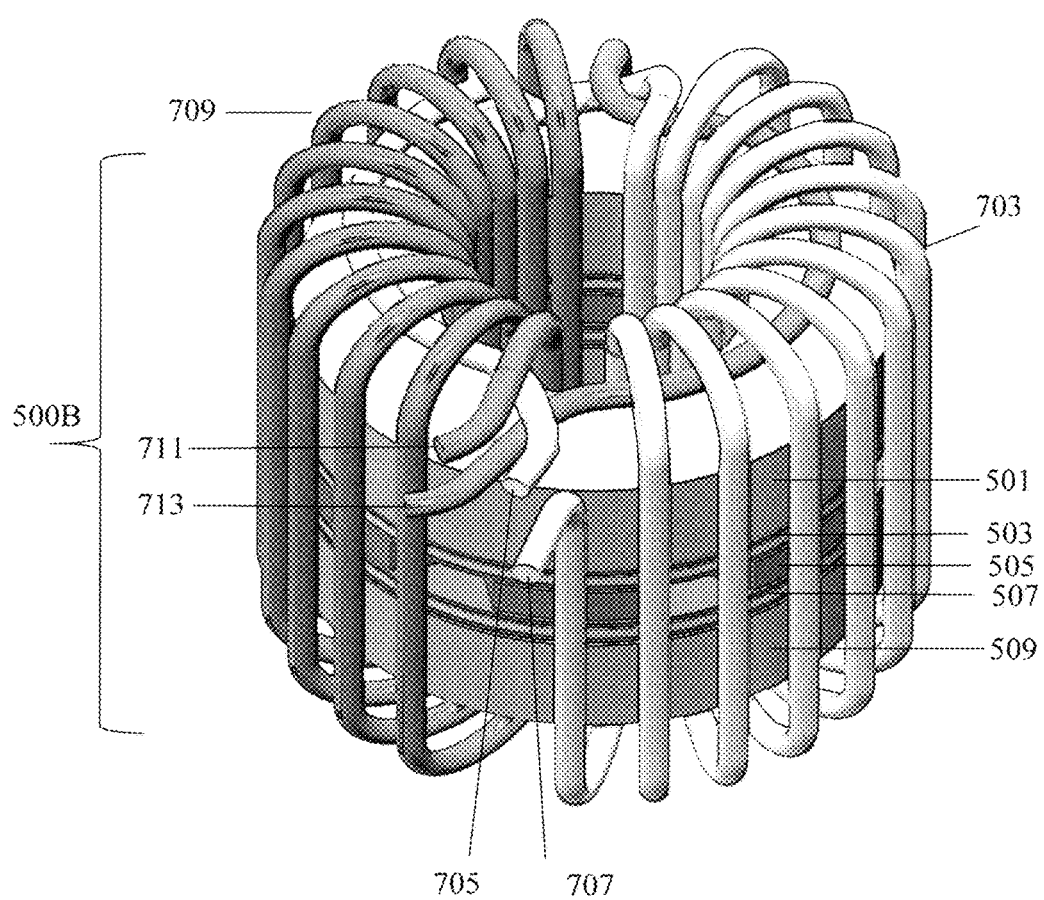
FIG. 8 shows a top view of one embodiment of winding arrangements for the present invention inductive capacitive reactor described above, using single winding arrangements.

FIG. 8 shows a top view of one embodiment of winding arrangements for the present invention inductive capacitive reactor 500A described above, using single winding arrangements. By single winding is meant that all of the "donut" components are stacked together and the wires are wrapped upon a single bundle. Alternatives are discussed/shown below. Here the identical numbers of FIG. 7B are repeated for the identical components. Windings include a hot wire 703 and a ground wire 709. Hot wire 703 enters at truncation 705 and is wound around the bundle approximately 12 times here, and passes once at right angles to and under the other winding, as shown, and ends at truncation 707. Likewise, ground wire 709 enters at truncation 711 and is wound around the bundle approximately 12 times here opposite hot wire 703, and passes once at right angles to and under the hot winding, as shown, and ends at truncation 713. These are wired pursuant to FIGS. 1, 2 and 3 above.

Figure 9:
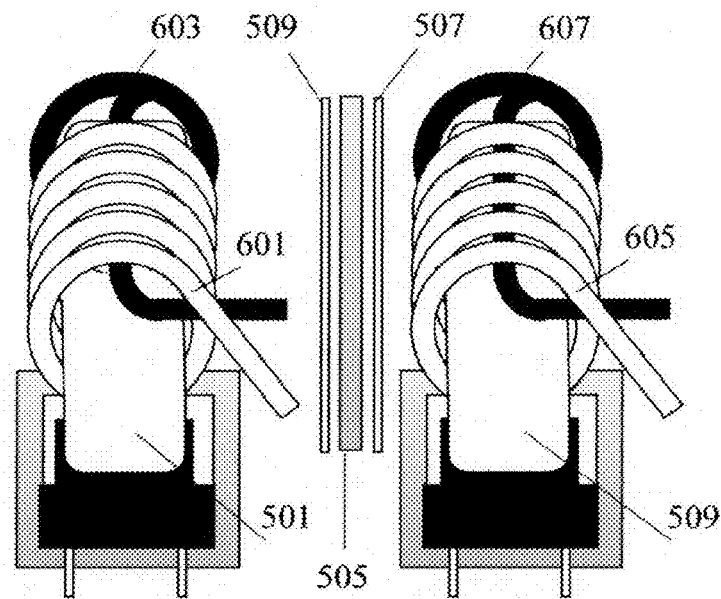
FIG. 9 shows a top view and FIG. 10 shows a side view of one embodiment of the present invention assembled inductive capacitive reactor wherein a plurality of disparate windings are utilized, representing a different winding format, but achieving results that would be achieved with the single windings shown in FIG. 8; and, FIGS. 11 through 16 illustrate top view footprints of various present invention inductive capacitive reactors.
Figure 10:
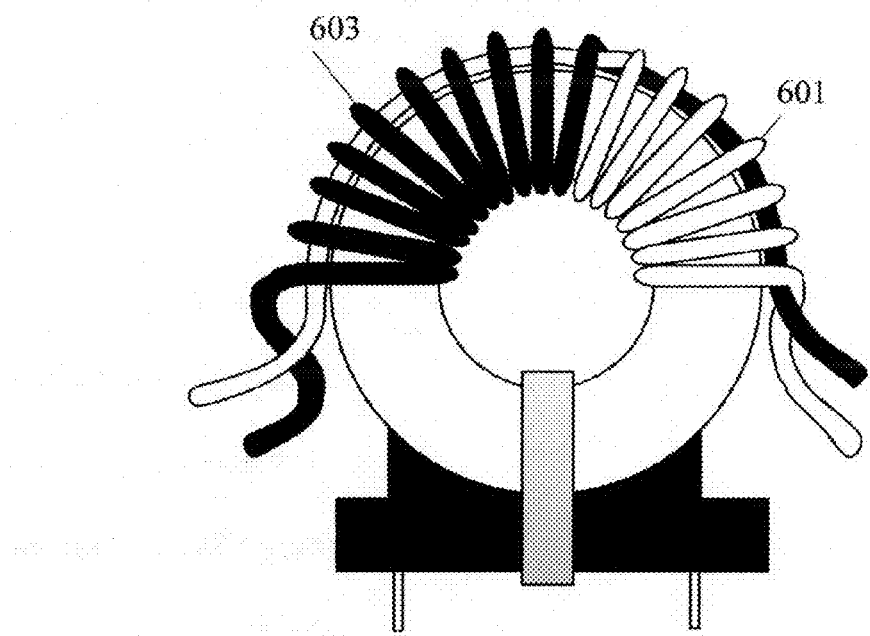

FIG. 9 shows a top view and FIG. 10 shows a side view of one embodiment of the present invention blown apart inductive capacitive reactor 500A, but wherein a plurality of disparate windings are utilized. Thus, the components shown in FIG. 7A are identically numbered, but spaced apart as shown in these FIGS. 9 and 10. Here there are two sets of wires, one for each torroid. The first set has hot wire 601 and ground 603, and the second set has hot wire 605 and ground 607. Note that they are wrapped around the torroid in separate areas, but each includes an end run that travels at right angles to and under the other, as particularly evident in FIG. 10.

Figure 11:
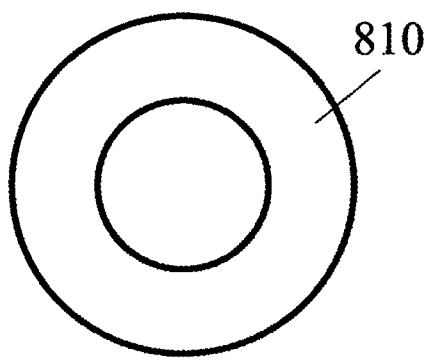
Figure 12:
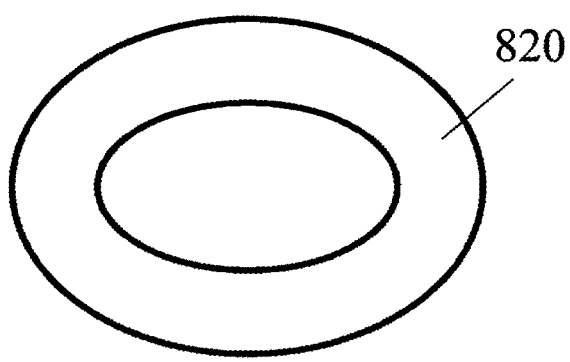
Figure 13:
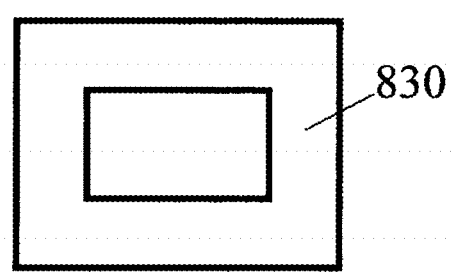
Figure 14:
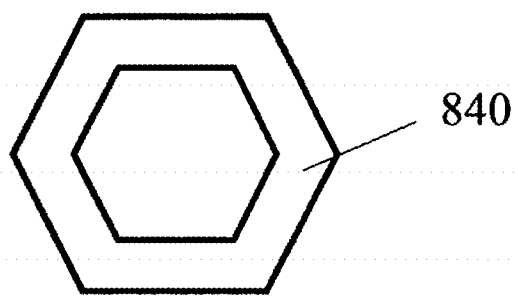
Figure 15:
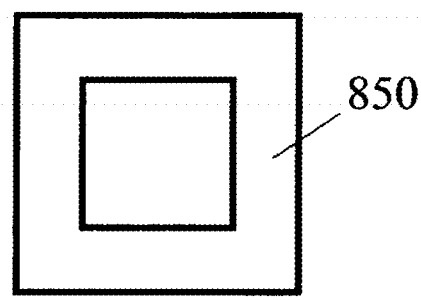
Figure 16:
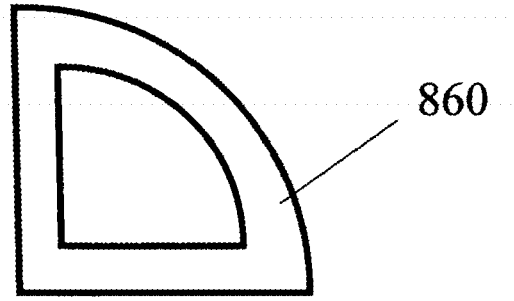

FIGS. 11 through 16 illustrate top view footprints of various present invention inductive capacitive reactors. FIG. 11 illustrates a circular shape 810; FIG. 12 illustrates an oval shape 820; FIG. 13 illustrates a rectangular shape 830; FIG. 14 illustrates an hexagonal (polygonal family) shape 840; FIG. 15 illustrates a square shape 850; and FIG. 16 illustrates an irregular shape 860. Irregular shapes may be necessary to fit an small energy saver device into an appliance for example. Other symmetrical shapes and asymmetrical shapes are contemplated without exceeding the scope of the present invention.

Although particular embodiments of the invention have been described in detail herein with reference to the accompanying drawings, it is to be understood that the invention is not limited to those particular embodiments, and that various changes and modifications may be effected therein by one skilled in the art without departing from the scope or spirit of the invention as defined in the appended claims.

What is claimed is:

1. An energy saving device for reducing electrical consumption utilizing at least one inductive capacitive reactor, for residential and similar amperage needs, wherein that at least one reactor functions as a multifaceted transformer with both inductive and capacitor functionalities and that operates iteratively, which comprises:
   a.) components of an energy saving device that includes: an EMI filter; surge suppression mechanism; harmonic filters; a snubber network filter; and storage components; and
   b.) at least one inductive capacitive reactor, wherein said at least one inductive capacitive reactor includes a stacked group of hollow centered continuous loop components sequentially arranged as follows:
      (i) a first ferrite toroidal component;

(ii) a first separator component, being a doped separator component;
(iii) a non-magnetic conductive metal toroidal component having a plurality of protrusions with notches between said protrusions;
(iv) a second separator component, selected from the group consisting of doped and non-doped;
(v) a second ferrite toroidal component;
and windings, including:
(vi) at least a first incoming wire being wrapped around a portion of at least said first ferrite toroidal component, being a hot wire;
(vii) at least a second incoming wire being wrapped around a portion of at least a first ferrite toroidal component, being a ground wire.

2. The energy saving device of claim 1 wherein said windings include:
(vi) said first incoming wire being wrapped around a portion of all of said stacked group of hollow centered continuous loop components, being a hot wire;
(vii.) said second incoming wire being wrapped around a portion of all of said stacked group of hollow centered continuous loop components, being a ground wire.

3. The energy saving device of claim 1 wherein said windings include:
(vi) said first incoming wire being wrapped around a portion of said first ferrite toroidal component, being a hot wire;
(vii.) said second incoming wire being wrapped around a portion of first ferrite toroidal component, being a ground wire;
(viii.) a third incoming wire being wrapped around a portion of said second ferrite toroidal component, being a hot wire;
(ix.) a fourth incoming wire being wrapped around a portion of said second ferrite toroidal component, being a ground wire.

4. The energy saving device of claim 1 wherein said doped separator of said at least one inductive capacitive reactor contains dope selected from the group consisting of gallium nitride, gallium arsenide, boron nitride, graphite, and graphene.

5. The energy saving device of claim 1 wherein said ferrite toroidal component of said at least one inductive capacitive reactor has a frequency in the range of 25 Hertz to 1 Gigahertz and wherein said separator components inductive capacitive reactor are dielectric film separator components.

6. The energy saving device of claim 1 wherein said at least one inductive capacitive reactor has a first non-conductive end piece on top of said first ferrite toroidal component and has a second non-conductive end piece under said second ferrite toroidal component, wherein said first non-conductive end piece on top of said first ferrite toroidal component and said second non-conductive end piece under said second ferrite toroidal component are selected from the group consisting of fiberglass, fiberglass encapsulation, epoxy and epoxy encapsulation.

7. The energy saving device of claim 1, which further includes a multiphase arrangement of more than one such inductive capacitive reactor connected directly or indirectly to one another selected from the group consisting of two said inductive capacitive reactors for a two phase combination, and three inductive capacitive reactors for a three phase combination.

8. An energy saving device for reducing electrical consumption utilizing at least one inductive capacitive reactor, for residential and similar amperage needs, wherein that at least one reactor functions as a multifaceted transformer with both inductive and capacitor functionalities and operates iteratively, said energy saving device comprises:
a.) connecting means for connection to an incoming power supply of a facility, for connection in parallel, including a hot line and a neutral line, and at least one ground, and having the following components connected between said hot line and said neutral line, in the following order;
b.) at least one front capacitor of predetermined capacitance, with a resistor;
c.) at least two front arc suppressors;
d.) at least one front metal oxide varistor line transient voltage surge suppressor having a predetermined number of joules capability to suppress undesired power spikes;
e.) at least one inductive capacitive reactor;
f.) at least a second capacitor of its own predetermined capacitance;
g.) at least one metal oxide varistor having a predetermined number of joules capability;
h.) at least two capacitors, each with a resistor, each of said at least two capacitors, each having its own predetermined capacitance different from one another;
wherein said at least one inductive capacitive reactor includes a stacked group of hollow centered continuous loop components sequentially arranged as follows:
(i) a first ferrite toroidal component;
(ii) a first separator component, being a doped separator component;
(iii) a non-magnetic conductive metal toroidal component having a plurality of protrusions with notches between said protrusions;
(iv) a second separator component, selected from the group consisting of doped and non-doped;
(v) a second ferrite toroidal component;
and windings, including:
(vi) at least a first incoming wire being wrapped around a portion of at least said first ferrite toroidal component, being a hot wire;
(vii) at least a second incoming wire being wrapped around a portion of at least a first ferrite toroidal component, being a ground wire.

9. The energy saving device of claim 8 wherein said windings include:
(vi) said first incoming wire being wrapped around a portion of all of said stacked group of hollow centered continuous loop components, being a hot wire;
(vii.) said second incoming wire being wrapped around a portion of all of said stacked group of hollow centered continuous loop components, being a ground wire.

10. The energy saving device of claim 8 wherein said windings include:
(vi) said first incoming wire being wrapped around a portion of said first ferrite toroidal component, being a hot wire;
(vii.) said second incoming wire being wrapped around a portion of first ferrite toroidal component, being a ground wire;
(viii.) a third incoming wire being wrapped around a portion of said second ferrite toroidal component, being a hot wire;
(ix.) a fourth incoming wire being wrapped around a portion of said second ferrite toroidal component, being a ground wire.

11. The energy saving device of claim 8 wherein said doped separator of said at least one inductive capacitive reactor contains dope selected from the group consisting of gallium nitride, gallium arsenide, boron nitride, graphite, and graphene.

12. The energy saving device of claim 8 wherein said ferrite toroidal component of said at least one inductive capacitive reactor has a frequency in the range of 25 Hertz to 1 Gigahertz and wherein said separator components inductive capacitive reactor are dielectric film separator components.

13. The energy saving device of claim 8 wherein said at least one inductive capacitive reactor has a first non-conductive end piece on top of said first ferrite toroidal component and has a second non-conductive end piece under said second ferrite toroidal component, wherein said at least one inductive capacitive reactor said first non-conductive end piece on top of said first ferrite toroidal component and said second non-conductive end piece under said second ferrite toroidal component are selected from the group consisting of fiberglass, fiberglass encapsulation, epoxy and epoxy encapsulation.

14. The energy saving device of claim 8, which further includes a multiphase arrangement of more than one such inductive capacitive reactor connected directly or indirectly to one another selected from the group consisting of two said inductive capacitive reactors for a two phase combination, and three inductive capacitive reactors for a three phase combination.

15. The energy saving device system of claim 9 wherein said at least one inductive capacitive reactor has windings as follows:

said first incoming wire being wrapped around a first portion of said first ferrite toroidal component, being a hot wire, and said second incoming wire being wrapped around a second, different portion of first ferrite toroidal component, being a ground wire, and further wherein a section of said first incoming wire passes at right angles under said second incoming wire, and wherein a section of said second incoming wire passes at right angles under said first incoming wire; and, said third incoming wire being wrapped around a first portion of said second ferrite toroidal component, being a hot wire, and said fourth incoming wire being wrapped around a second, different portion of said second ferrite toroidal component, being a ground wire, and further wherein a section of said third incoming wire passes at right angles under said fourth incoming wire, and wherein a section of said fourth incoming wire passes at right angles under said third incoming wire.

16. The energy saving device of claim 8 wherein said at least a second capacitor is a plurality of capacitors having different capacitances.

17. The energy saving device of claim 8 wherein said components are arranged for operating as a single phase device.

18. The energy saving device of claim 8 wherein said components are duplicated to create two connected sets thereof and are arranged for operation as a two phase device.

19. The energy saving device of claim 8 further including the following component: at least one resistor having a predetermined resistance.

20. The energy saving device of claim 8 wherein said components are triplicated therein to form three connected sets thereof and are arranged as a three phase device, and further wherein each set of said triplicated component's at least two capacitors is at least three capacitors, each having its own predetermined capacitance different from one another.

* * * * *